United States Patent
Keh et al.

(10) Patent No.: US 8,034,644 B2
(45) Date of Patent: Oct. 11, 2011

(54) LIGHT EMITTING DEVICE

(75) Inventors: Kean Loo Keh, Gelugor (MY); Lig Yi Yong, Simpang Ampat (MY); Kum Soon Wong, Kuala Lumpur (MY)

(73) Assignee: Avago Technologies ECBU IP (Singapore) Pte. Ltd., Singapore (SG)

( * ) Notice: Subject to any disclaimer, the term of this patent is extended or adjusted under 35 U.S.C. 154(b) by 178 days.

(21) Appl. No.: 12/359,123

(22) Filed: Jan. 23, 2009

(65) Prior Publication Data

US 2010/0190279 A1 Jul. 29, 2010

(51) Int. Cl.
*H01L 21/00* (2006.01)

(52) U.S. Cl. ......... 438/22; 438/106; 438/121; 438/406; 438/611; 257/81; 257/89; 257/100; 257/E33.001

(58) Field of Classification Search ............ 438/22, 438/25–28, 70, 100, 106, 110, 111, 121, 438/123, 406, 461, 584, 597, 611; 257/81, 257/89, 98, 99, 100, E33.001, E33.055, E33.058, 257/E33.059, E23.032, E23.034, E23.042
See application file for complete search history.

(56) References Cited

U.S. PATENT DOCUMENTS

| | | | | |
|---|---|---|---|---|
| 4,209,358 A * | 6/1980 | DiLeo et al. | ................ | 156/293 |
| 5,404,282 A * | 4/1995 | Klinke et al. | ............ | 362/249.06 |
| 5,455,199 A * | 10/1995 | Sakamoto | ................ | 438/26 |
| 5,557,116 A * | 9/1996 | Masui et al. | ................ | 257/100 |
| 5,825,054 A * | 10/1998 | Lee et al. | ................ | 257/98 |
| 6,407,411 B1 * | 6/2002 | Wojnarowski et al. | ......... | 257/99 |
| 7,344,296 B2 | 3/2008 | Matsui | | |
| 7,466,076 B2 * | 12/2008 | Lin et al. | ................ | 313/512 |
| 2002/0119598 A1 * | 8/2002 | Kawata et al. | ................ | 438/107 |
| 2005/0211992 A1 | 9/2005 | Nomura | | |
| 2006/0038187 A1 | 2/2006 | Ueno | | |
| 2006/0119250 A1 | 6/2006 | Suehiro | | |
| 2006/0220052 A1 * | 10/2006 | Kamiya et al. | ................ | 257/99 |
| 2008/0002100 A1 | 1/2008 | Kaneko | | |

* cited by examiner

*Primary Examiner* — Khiem D Nguyen
*Assistant Examiner* — Su Kim

(57) ABSTRACT

Methods of making a light emitter are disclosed herein. An embodiment of a method comprises fabricating a line of first leads, the line of first leads comprising a plurality connected individual first leads; fabricating a line of second leads, the line of second leads comprising a plurality of connected individual second leads; physically connecting the line of first leads to the line of second leads, wherein a first individual first lead is adjacent a first individual second lead; attaching a light emitting device to the first individual first lead; electrically connecting the light emitting device to the first individual second lead; encapsulating a portion of the individual first lead and a portion of the individual second lead as a single unit; and separating the encapsulated first individual lead and the second individual lead from the first line of leads and the second line of leads.

14 Claims, 3 Drawing Sheets

LIGHT EMITTING DEVICE

BACKGROUND

Light emitting devices using light emitting diodes have become extremely popular. One area of use of such light emitting devices is in the area of outdoor electronic signs and signals. Currently, light emitting devices using TTW (through the wave) soldering packages are dominant in this field. TTW type light emitting devices tend to have better optical performance, potting capabilities, and other benefits over SMT (surface mount technology) devices. However, surface mount technology offers benefits in manufacturing over through the wave techniques.

DETAILED DESCRIPTION

Figure 1:
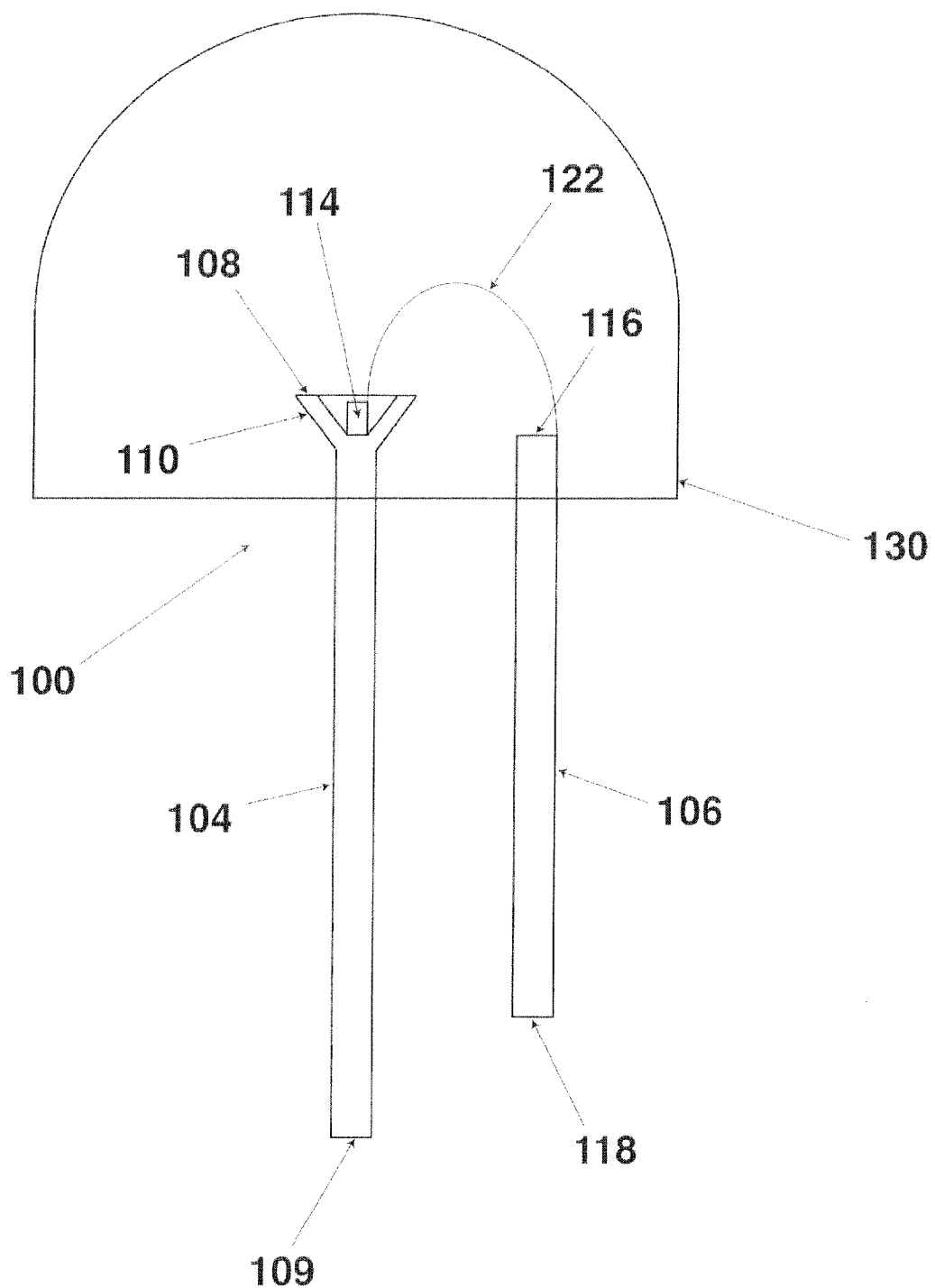
FIG. 1 is an embodiment of a light emitter.

Light emitters and methods of making light emitters are disclosed herein. An embodiment of a completed light emitter 100 is shown in FIG. 1. In some embodiments, the light emitter 100 is a surface mount technology (SMT) device that has the characteristics of a through the wave (TTW) type device. The light emitter 100 is described followed by methods of making the light emitter 100.

The light emitter 100 includes a first lead 104 and a second lead 106. As described in greater detail below, the first lead 104 and the second lead 106 may be configured to make the light emitter 100 a surface mount technology type device. For example, the leads may be bent per SMT specifications. The first lead 104 has a first end 108 and a second end 109. A cup 110 is formed on the first end 108 of the first lead 104. The cup 110 receives a light emitting device 114, which in some embodiments is a light emitting diode 114. In embodiments where the light emitting device is a light emitting diode 114, one of the first lead 104 or the second lead 106 may be an anode and the other lead may be a cathode.

The second lead 106 may also have a first end 116 and a second end 118. A wire 122 or other conductor is connected between the LED 114 and the first end 116 of the second lead 106. The wire 122 completes a circuit from the first lead 104, through the LED 114, through the wire 122, and to the second lead 106. The application of a potential between the first lead 104 and the second lead 106 causes the LED 114 to illuminate by way of the circuit.

A lens 130 surrounds the first ends 110, 116 of the leads 104, 106. The lens 130 may serve as a shell and/or a containment device for an encapsulant that encapsulates the first ends 110, 116 of the leads 104, 106. Alternatively, the lens 130 may be formed by the encapsulant.

Figure 2:
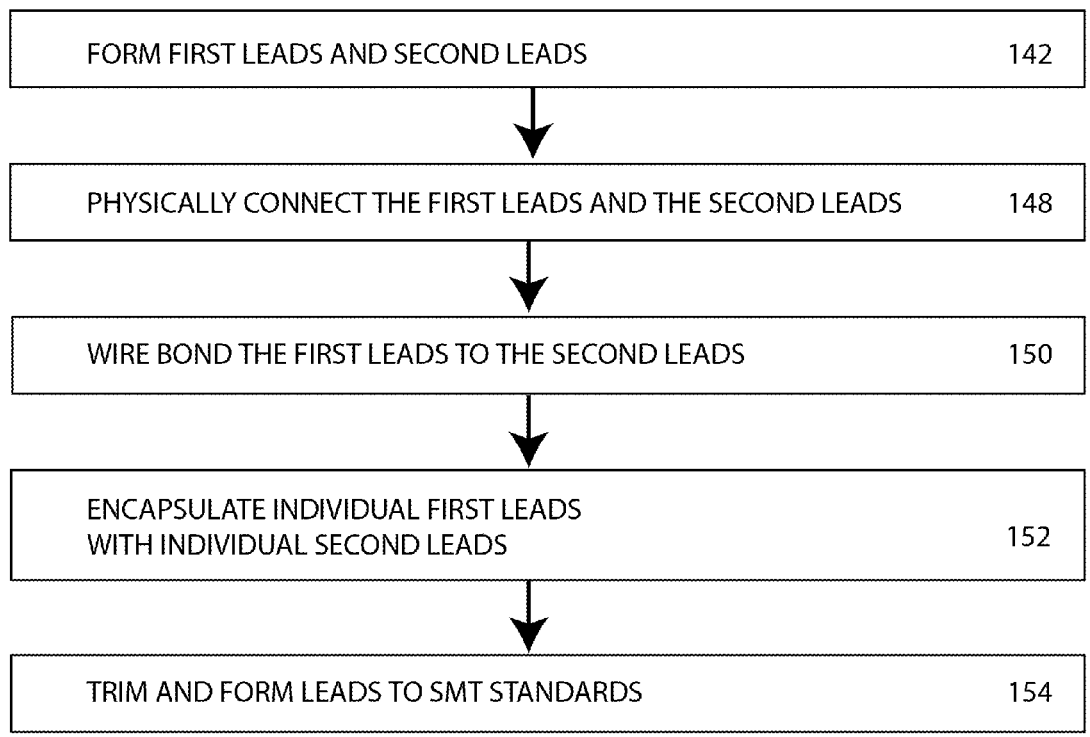
FIG. 2 is a flow chart describing an embodiment for manufacturing the light emitter of FIG. 1.

Having described the light emitter 100, methods of making the light emitter 100 will now be described. In summary, the light emitter 100 is able to have the advantages of a thru-hole device, but in a surface mount package. For example, the lens 130 may be of the type used in thru-hole devices. A flow chart describing embodiments of the process or making the light emitter 100 is shown in FIG. 2.

Figure 3:
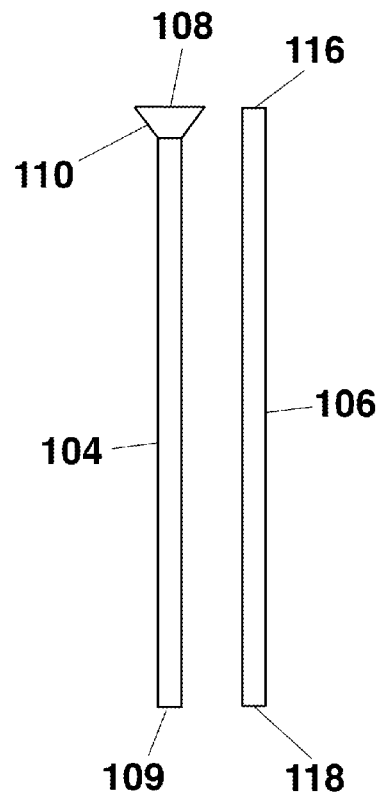
FIG. 3 is an embodiment of leads used to manufacture the light emitter of FIG. 1.
Figure 4:
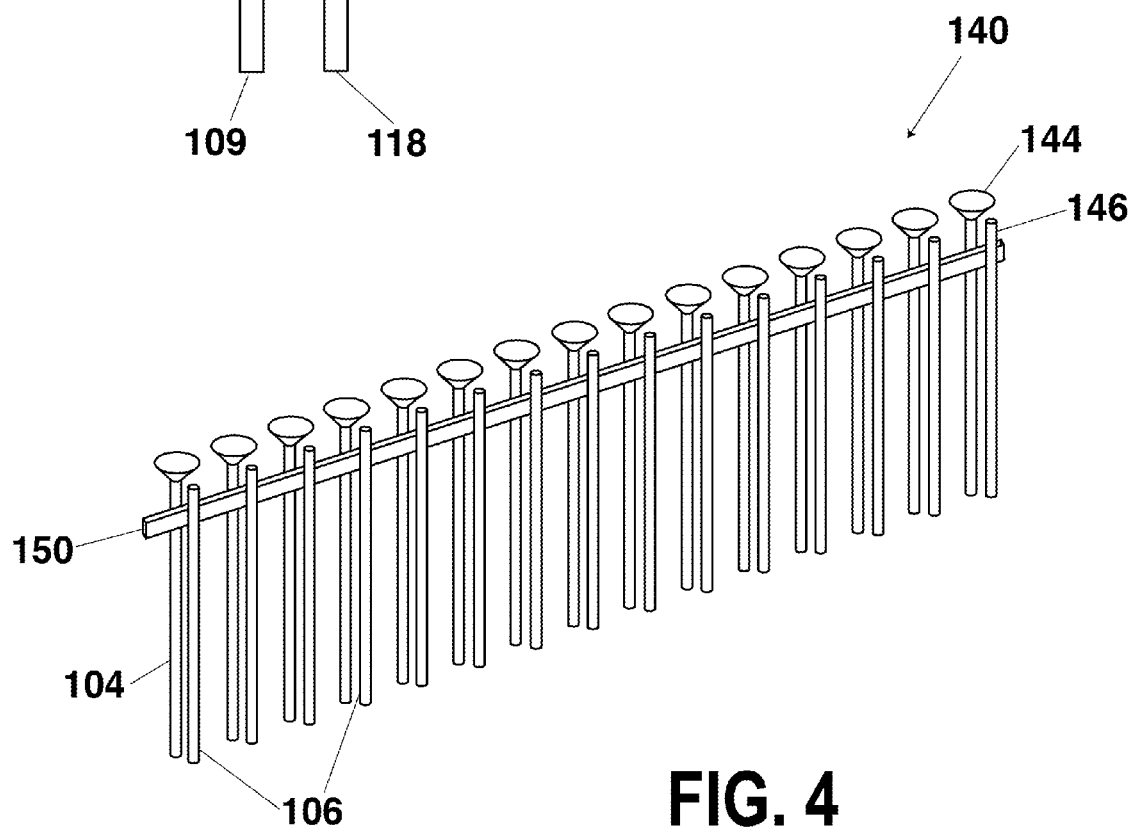
FIG. 4 is an embodiment of lead frames used to manufacture the leads of FIG. 3.

With additional reference to FIGS. 3 and 4, construction of the light emitter 100 starts with two parallel lead frames. FIG. 3 shows embodiments of the first lead 104 and the second lead 106, which may be a front view of the lead frame. FIG. 4 shows a plurality of leads 104, 106 configured as a single parallel lead frame 140. The process starts at step 142 in the flow chart of FIG. 2 with fabricating the first leads 104 and the second leads 106. The leads 104, 106 may be fabricated to form a line of first leads 144 and a line of second leads 146 as shown in FIG. 4. In some embodiments, the first leads 104 and the second leads 106 may be fabricated as the lines of leads 144, 146 as shown in FIGS. 3 and 4. The first leads 104 have cups 110 as described above and may have LEDs put into the cups 110 at this time. In other embodiments, the LEDs may be added to the cups 110 at a later time.

The line of first leads 144 is connected to the line of second leads 146 per step 148. The line of first leads 144 and the line of second leads 146 are configured so that a first lead 104 is positioned relative to a second lead 106 as they would be positioned in the light emitter 100 of FIG. 1. The configuration of the line of first leads 144 and the line of second leads 146 yields the parallel lead frame 140 as shown in FIG. 4. In the embodiment of FIG. 4, a rail 150 is used to attach the line of first leads 144 to the line of second leads 146. Other devices and methods may be used to connect the line of first leads 144 to the line of second leads 144, such as spot welding, adhesives, or clamping.

After the first line of leads 144 are physically connected to the second line of leads 146 as described above, the first line of leads 144 is electrically connected to the second line of leads 146 per step 150. More specifically, the LEDs in the cups 110 of the first leads 104 are wire bonded to the second leads 106. The result is wiring of the light emitter 100 as shown in FIG. 1. Because the first line of leads 144 is physically connected to the second line of leads 146, there is little chance that a wire bond will break during the rest of the manufacturing processes.

At step 152, individual first leads 104 are encapsulated with individual second leads 106. The result is the light emitter 100 of FIG. 1 except for the second ends 109, 118 of the leads 104, 106. In some embodiments, the lead frame 140 is positioned up side down so that the first ends 108, 116 of the leads 104, 106 may be placed in molds for encapsulation. The light emitters 100 have many of the same characteristics of a TTW device.

At step 154, the leads 104, 106 are trimmed and formed to per SMT standards. For example, the second ends 109, 118 of the leads 104, 106 may be bent away from one another to that the light emitter may be mounted using SMT. The result is an SMT device that has TTW light characteristics.

What is claimed is:

1. A method of making a light emitter, the method comprising:

fabricating a line of first leads, the line of first leads comprising a plurality of connected individual first leads each having a cup formed on a first end thereof;

fabricating a line of second leads, the line of second leads comprising a plurality of connected individual second leads;

physically connecting the line of first leads to the line of second leads, wherein a first individual first lead is adjacent a first individual second lead and wherein the physically connecting comprises at least one of (i) spot welding the first line of leads to the second line of leads and (ii) clamping the first line of leads to the second line of leads;

attaching a light emitting device to the first individual first lead within the cup formed on the first end of the first individual lead such that the light emitting device is located substantially along a major axis of the first individual lead;

electrically connecting the light emitting device to the first individual second lead;

encapsulating a portion of the individual first lead and a portion of the individual second lead as a single unit; and separating the encapsulated first individual lead and the second individual lead from the first line of leads and the second line of leads.

2. The method of claim 1 wherein the light emitting device is a light emitting diode.

3. The method of claim 1, wherein the physically connecting comprises adhering the first line of leads to the second line of leads.

4. The method of claim 1, wherein the attaching a light emitting device to the first individual first lead comprises electrically connecting the light emitting device to the first individual first lead.

5. The method of claim 1, wherein the electrically connecting the light emitting device to the first individual second lead comprises wire bonding the light emitting device to the first individual second lead.

6. The method of claim 5, wherein the encapsulating comprises encapsulating the wire bond.

7. The method of claim 5, and further comprising trimming the leads.

8. The method of claim 5, and further comprising trimming the leads to render the light emitter as a surface mount device.

9. The method of claim 1, wherein the encapsulating comprises forming a lens using an encapsulant.

10. The method of claim 1, wherein the encapsulating comprises placing the end of the first individual first lead and the end of the first individual second lead in a mold and placing an encapsulant in the mold the lead ends.

11. The method of claim 1, wherein the attaching a light emitting device to the first individual first lead, comprises electrically connecting the light emitting device to the first individual first lead.

12. A method of making a light emitter, the method comprising:

fabricating a line of first leads, the line of first leads comprising a plurality connected individual first leads;

fabricating a line of second leads, the line of second leads comprising a plurality of connected individual second leads;

physically connecting the line of first leads to the line of second leads with a rail, wherein a first individual first lead is on a first side of the rail and adjacent a first individual second lead which is on a second side of the rail, wherein the second side of the rail opposes the first side of the rail;

attaching a light emitting device to the first individual first lead;

electrically connecting a first node of the light emitting device to the first individual first lead;

electrically connecting a second node of the light emitting device to the first individual second lead;

encapsulating a portion of the individual first lead and a portion of the individual second lead as a single unit, wherein the encapsulating includes the light emitting device and the connection to the first individual second lead;

separating the encapsulated first individual lead and the second individual lead from the first line of leads and the second line of leads; and forming the first individual first lead and the first individual second lead to make the light emitter a surface mount device.

13. The method of claim 12, wherein the electrically connecting a second node of the light emitting device to the first individual second lead comprises wire bonding a second node of the light emitting device to the first individual second lead.

14. A light emitter made by a method comprising:

fabricating a line of first leads, the line of first leads comprising a plurality of connected individual first leads each having a cup formed on a first end thereof;

fabricating a line of second leads, the line of second leads comprising a plurality of connected individual second leads;

physically connecting the line of first leads to the line of second leads with a rail, wherein a first individual first lead is on a first side of the rail and adjacent a first individual second lead which is on a second side of the rail, wherein the second side of the rail opposes the first side of the rail;

attaching a light emitting device to the first individual first lead within the cup formed on the first end of the first individual lead such that the light emitting device is located substantially along a major axis of the first individual lead;

electrically connecting the light emitting device to the first individual second lead;

encapsulating a portion of the individual first lead and a portion of the individual second lead as a single unit; and separating the encapsulated first individual lead and the second individual lead from the first line of leads and the second line of leads.

* * * * *